(12) United States Patent
Kessler et al.

(10) Patent No.: US 12,087,740 B2
(45) Date of Patent: Sep. 10, 2024

(54) METHOD OF FORMING A SEMICONDUCTOR MODULE

(71) Applicant: Infineon Technologies Austria AG, Villach (AT)

(72) Inventors: Angela Kessler, Sinzing (DE); Josef Hoeglauer, Heimstetten (DE); Gerhard Noebauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/381,929

(22) Filed: Oct. 19, 2023

(65) Prior Publication Data

US 2024/0047431 A1   Feb. 8, 2024

Related U.S. Application Data

(63) Continuation of application No. 17/480,611, filed on Sep. 21, 2021, now Pat. No. 11,817,430.

(30) Foreign Application Priority Data

Sep. 24, 2020 (EP) ..................... 20198168

(51) Int. Cl.
*H01L 25/07* (2006.01)
*H01L 23/00* (2006.01)
(Continued)

(52) U.S. Cl.
CPC .......... *H01L 25/072* (2013.01); *H01L 23/481* (2013.01); *H01L 23/49822* (2013.01);
(Continued)

(58) Field of Classification Search
CPC ................. H01L 25/072; H01L 23/481; H01L 23/49822; H01L 23/5383; H01L 24/06; H01L 24/08
See application file for complete search history.

(56) References Cited

U.S. PATENT DOCUMENTS

| | | | |
|---|---|---|---|
| 2002/0096779 | A1 | 7/2002 | Feldtkeller et al. |
| 2003/0169549 | A1 | 9/2003 | Ziemer et al. |

(Continued)

FOREIGN PATENT DOCUMENTS

| | | |
|---|---|---|
| DE | 102008040906 A1 | 2/2010 |
| EP | 2463904 A2 | 6/2012 |
| EP | 3478033 A1 | 5/2019 |

*Primary Examiner* — Nathan W Ha
(74) *Attorney, Agent, or Firm* — Murphy, Bilak & Homiller, PLLC

(57) ABSTRACT

A method of forming a semiconductor module comprises forming a laminate structure having an electrically insulating core layer with opposing first and second sides, a first redistribution layer arranged on the first side and a second redistribution layer arranged on the second side. First and second transistor devices are coupled to form a half-bridge circuit. Bots transistor devices have a first side at which a cell field is arranged and an opposing second side. A control chip has a first side with contact pads. The transistor devices and control chip are arranged laterally adjacent one another and embedded in the core layer. The first side of the control chip and one transistor device and the second side of the other transistor device face towards the first redistribution layer on the first side of the core layer.

20 Claims, 7 Drawing Sheets

(51) Int. Cl.
  *H01L 23/48*    (2006.01)
  *H01L 23/498*   (2006.01)
  *H01L 23/538*   (2006.01)

(52) U.S. Cl.
  CPC ......... *H01L 23/5383* (2013.01); *H01L 24/06* (2013.01); *H01L 24/08* (2013.01); *H01L 2224/06181* (2013.01); *H01L 2224/08235* (2013.01); *H01L 2924/13091* (2013.01)

(56) References Cited

U.S. PATENT DOCUMENTS

| | | |
|---|---|---|
| 2006/0017174 A1 | 1/2006 | Otremba |
| 2008/0054425 A1 | 3/2008 | Malhan et al. |
| 2008/0054439 A1 | 3/2008 | Malhan et al. |
| 2008/0157209 A1 | 7/2008 | Sutardja |
| 2013/0146991 A1 | 6/2013 | Otremba et al. |
| 2014/0001615 A1 | 1/2014 | Otremba et al. |
| 2014/0084433 A1 | 3/2014 | Otremba et al. |
| 2014/0306332 A1 | 10/2014 | Denison et al. |
| 2015/0014687 A1 | 1/2015 | Nakajima |
| 2015/0028448 A1 | 1/2015 | Hosseini et al. |
| 2015/0270249 A1 | 9/2015 | Cho |
| 2016/0300779 A1 | 10/2016 | Watanabe et al. |
| 2016/0322969 A1 | 11/2016 | Padmanabhan et al. |
| 2017/0092559 A1 | 3/2017 | Iwasaki et al. |
| 2017/0117238 A1 | 4/2017 | Romig et al. |
| 2017/0278762 A1 | 9/2017 | Kessler et al. |
| 2017/0288654 A1 | 10/2017 | Otremba et al. |
| 2017/0345714 A1 | 11/2017 | Scharf et al. |
| 2018/0068934 A1 | 3/2018 | Cho et al. |
| 2018/0096920 A1 | 4/2018 | Adriano et al. |
| 2018/0102302 A1 | 4/2018 | Grassmann et al. |
| 2018/0122745 A1 | 5/2018 | Cho et al. |
| 2018/0138111 A1 | 5/2018 | Grassmann et al. |
| 2018/0218960 A1 | 8/2018 | Takahagi et al. |
| 2018/0233469 A1 | 8/2018 | Palm et al. |
| 2018/0342447 A1 | 11/2018 | Ahlers et al. |
| 2019/0027381 A1 | 1/2019 | Kadoguchi et al. |
| 2019/0043825 A1 | 2/2019 | Yamaguchi et al. |
| 2020/0098676 A1* | 3/2020 | Elsherbini ............... H01L 23/36 |
| 2020/0105677 A1 | 4/2020 | Chiba et al. |
| 2020/0176033 A1* | 6/2020 | Hosotani ............ G11C 16/0483 |
| 2020/0195157 A1 | 6/2020 | Shiomi |
| 2020/0253034 A1 | 8/2020 | Long et al. |
| 2020/0273788 A1 | 8/2020 | Noebauer et al. |
| 2020/0281048 A1 | 9/2020 | Kopiness et al. |
| 2020/0411486 A1* | 12/2020 | Or-Bach ............... H01L 27/0688 |
| 2021/0043671 A1* | 2/2021 | Yoneda ............... H01L 27/1464 |
| 2021/0151428 A1* | 5/2021 | Dutta .................... H01L 23/481 |
| 2021/0328551 A1 | 10/2021 | Maalouf et al. |
| 2021/0343628 A1 | 11/2021 | Fang et al. |

\* cited by examiner

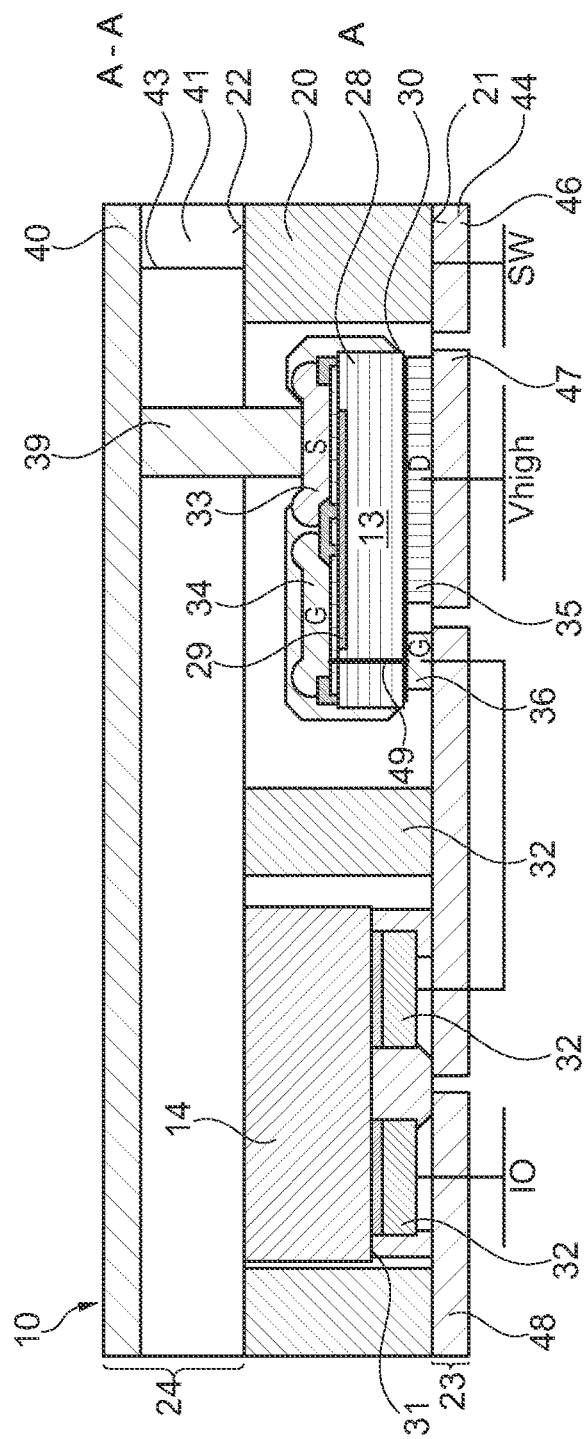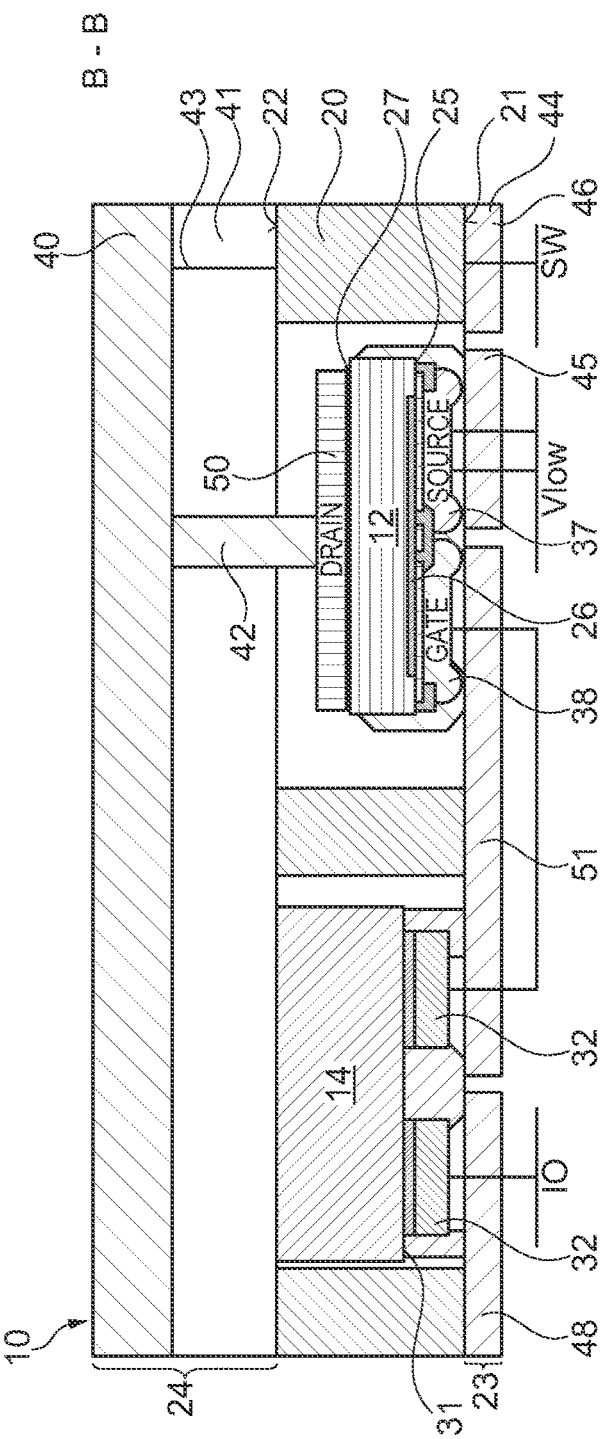

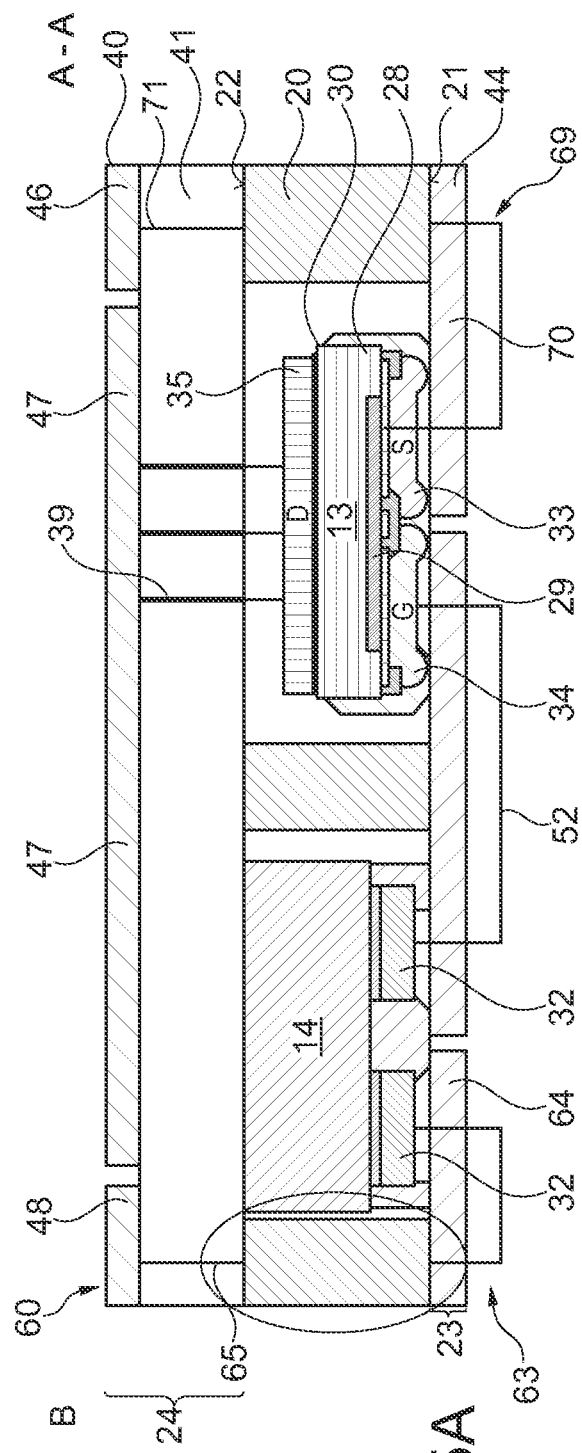
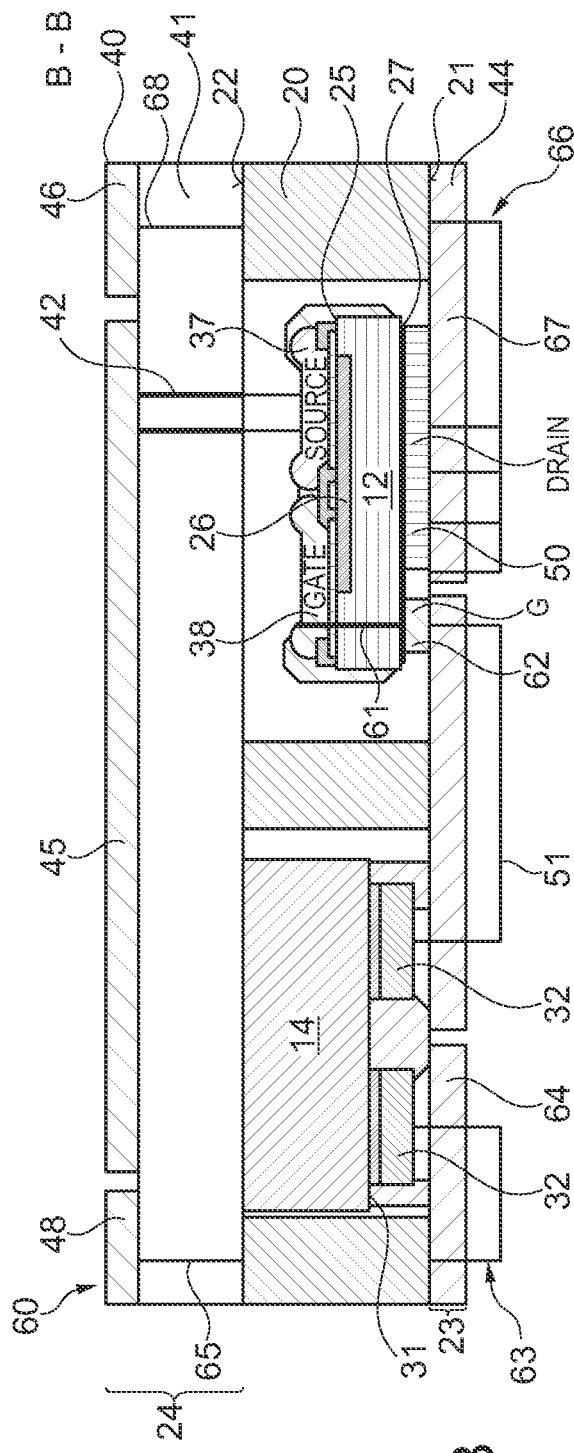
Fig. 5A
Fig. 5B

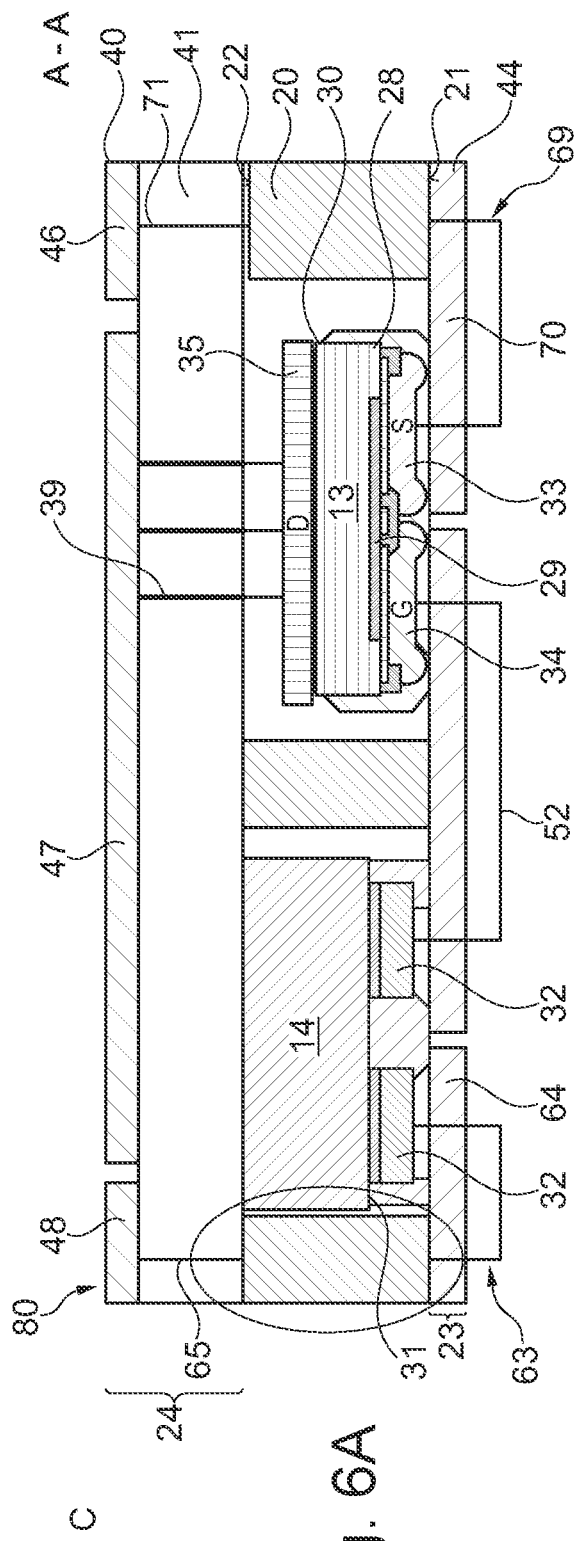
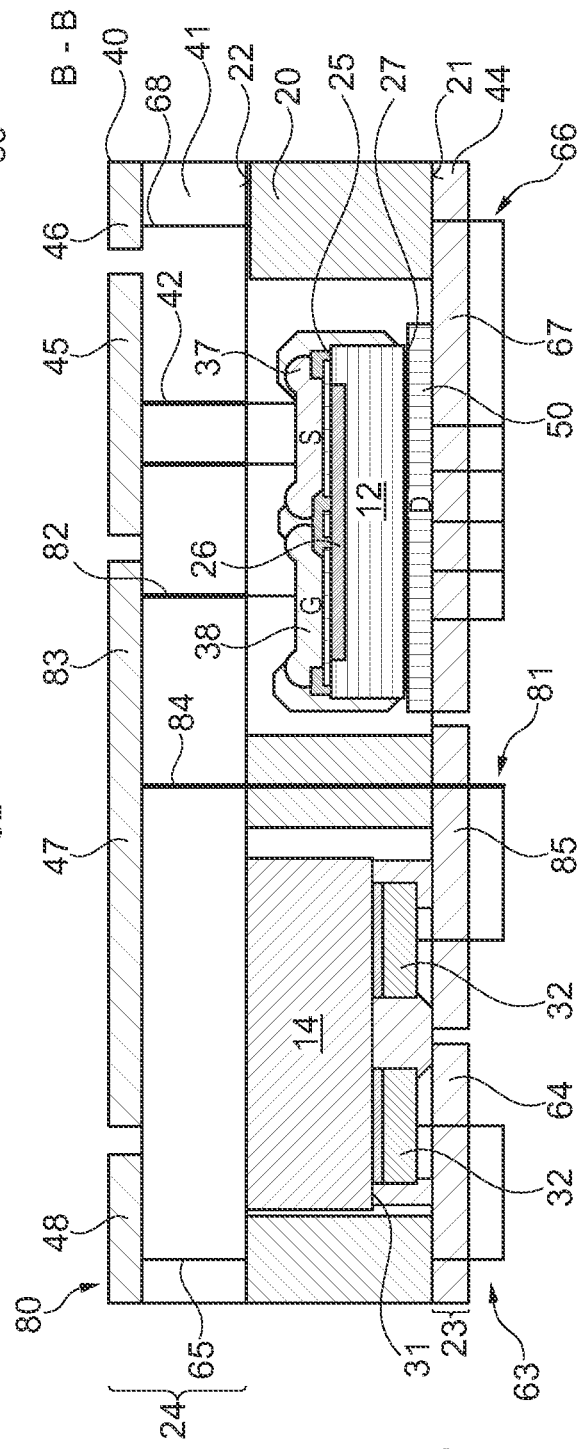
Fig. 6A
Fig. 6B

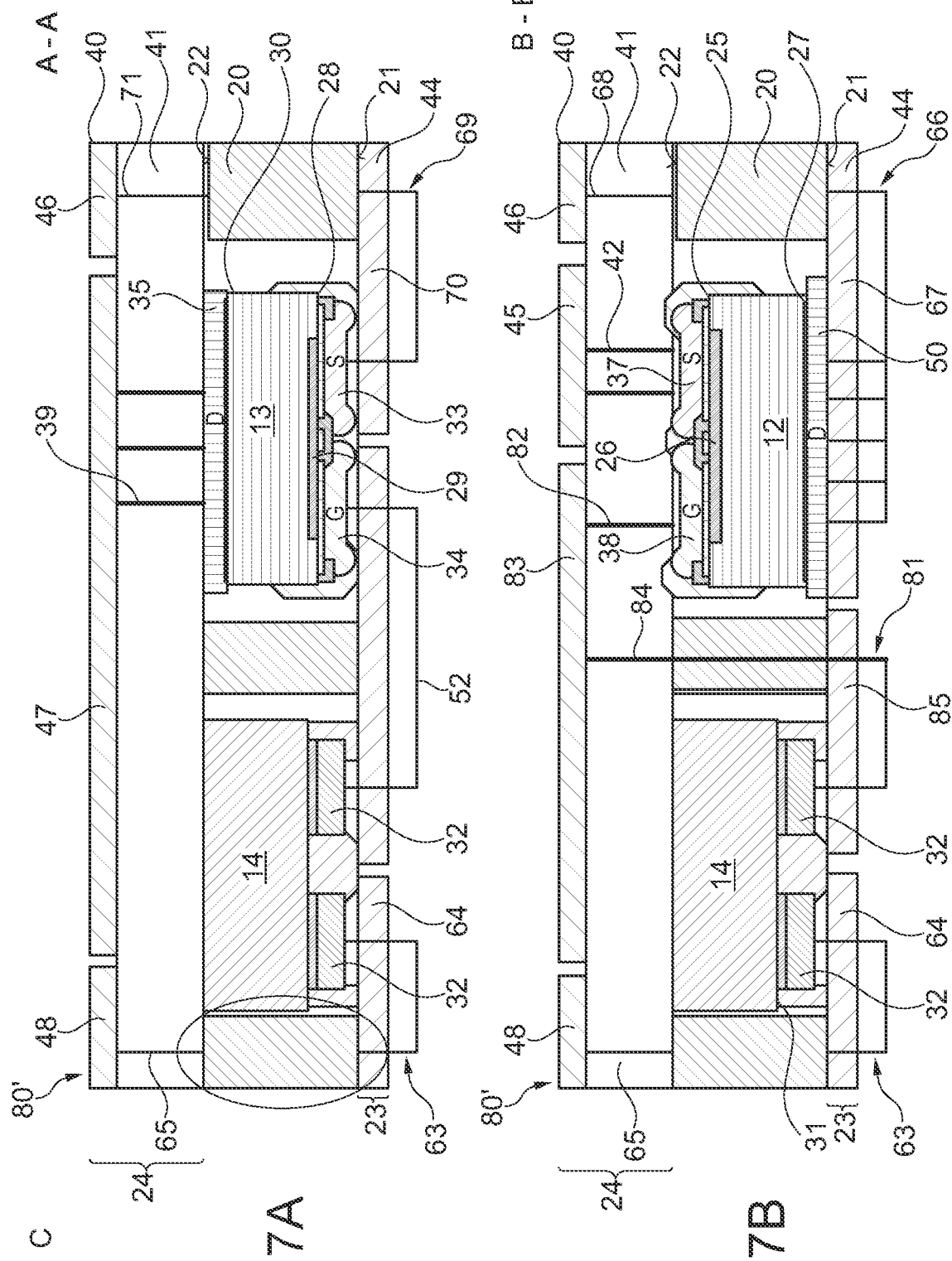

METHOD OF FORMING A SEMICONDUCTOR MODULE

BACKGROUND

Transistors used in power electronic applications are typically fabricated with silicon (Si) semiconductor materials. Common transistor devices for power applications include Si CoolMOS®, Si Power MOSFETs, and Si Insulated Gate Bipolar Transistors (IGBTs). These transistor devices may be connected together to provide circuits or sections of circuits. For example, two transistor devices may be electrically connected to form a half-bridge circuit. Such circuits typically require control circuitry including gate driver circuitry which may be used to switch the transistors.

Two transistor devices coupled to form a half-bridge circuit and a device with control circuitry may be accommodated within a single semiconductor package or module which may be referred to as a power stage. Providing the connections between the devices in a package or module has some challenges due to the limited space available space. EP 2 463 904 A2 discloses a multi-chip Power Quad Flat No-lead package in which a leadframe of the package is utilized for electrical interconnections. Further improvements to packages including more than one semiconductor device are desirable.

SUMMARY

According to the invention, a semiconductor module is provided that comprises a laminate structure comprising an electrically insulating core layer having a first side and a second side opposing the first side, a first redistribution layer arranged on the first side and a second redistribution layer arranged on the second side of the core layer. The semiconductor module further comprises a first transistor device and a second vertical transistor device coupled to form a half-bridge circuit. The first transistor device has a first side at which a cell field is arranged and a second side opposing the first side, and the second transistor device has a first side at which a cell field is arranged and a second side opposing the first side. The semiconductor module further comprises a control chip having a first side with contact pads. The first transistor device, the second transistor device and the control chip are arranged laterally adjacent one another and embedded in the core layer. The first side of the control chip, the first side of one of the first and second transistor devices and the second side of the other one of the first and second transistor devices face towards the first redistribution layer on the first side of the core layer.

In an embodiment, the first side of the control chip, the first side of the first transistor device and the second side of the second transistor device face towards the first redistribution layer on the first side of the core layer. Alternatively, the first side of the control chip, the first side of the second transistor device and the second side of the first transistor device face towards the first redistribution layer on the first side of the core layer.

In some embodiments, the first side of one of the first and second transistor devices and the second side of the other one of the first and second transistor devices and the first side of the control chip are substantially coplanar.

In some embodiments, the first transistor device provides the low side switch of the half-bridge circuit, the second transistor device provides the high side switch of the half-bridge circuit, the first side of first transistor device faces towards the first redistribution layer and the second side of the second transistor device faces towards the first redistribution layer. The second transistor device comprises one or more conductive device vias such that gate electrodes in the cell field at the first side of the second transistor device are electrically coupled by the conductive device via to a pad arranged on the second side of the second transistor device.

In some embodiments, the first transistor device provides the high side switch of the half-bridge circuit, the second transistor device provides the low side switch of the half-bridge circuit, the first side of first transistor device faces towards the first redistribution layer and the second side of the second transistor device faces towards the first redistribution layer. The second transistor device comprises one or more conductive device vias such that gate electrodes in the cell field at the first side of the second transistor device are electrically coupled by the conductive device via to a pad arranged on the second side of the second transistor device.

In some embodiments, the first transistor device provides the high side switch of the half-bridge circuit, the second transistor device provides the low side switch of the half-bridge circuit, the first side of first transistor device faces towards the first redistribution layer and the second side of the second transistor device faces towards the first redistribution layer. The semiconductor module further comprises one or more conductive vias extending through the core layer to couple one or more contact pads on the first side of the control chip that face towards the first redistribution layer to a gate pad of the second transistor that faces towards the second redistribution layer.

In some embodiments, the semiconductor module comprises a footprint comprising a $V_{high}$ pad, a $V_{low}$ pad, a switch node pad and one or more logic pads formed in the first redistribution layer on the first side of the core layer.

In some embodiments, the first and second transistor devices are coupled in series between the $V_{low}$ pad and the $V_{high}$ pad of the semiconductor module by a switch node connection.

In some embodiments, the switch node connection is provided by the second redistribution layer arranged on the second side of the core layer and is coupled to the switch node pad that is arranged on the first side of the core layer by one or more conductive vias that extend through the core layer.

In some embodiments, the first redistribution layer is structured and provides a signal redistribution structure coupling the control chip to a gate pad on the first side of the first transistor device and to a gate pad on the second side of the second transistor device, wherein the signal redistribution structure is arranged entirely on the first side of the core layer.

In some embodiments, the semiconductor module further comprises one or more conductive vias extending between a source pad arranged on a first side of the second transistor device and the switch node connection and one or more conductive vias extending between a drain pad on the second side of the first transistor device and the switch node connection.

In some embodiments, the semiconductor module comprises a footprint comprising a $V_{high}$ pad, a $V_{low}$ pad, a switch node (SW) pad and one or more logic pads formed in the second redistribution layer on the second side of the core layer.

In some embodiments, the semiconductor module further comprises a first redistribution structure comprising a lateral redistribution structure formed in the first redistribution layer arranged on the first side of the core layer and one or more conductive vias extending through the core layer. The first redistribution structure electrically couples one or more contact pads of the control chip to one of the logic pads formed in the second redistribution layer on the second side of the core layer. The semiconductor module further comprises second redistribution structure comprising a lateral redistribution structure formed in the first redistribution layer arranged on the first side of the core layer and one or more conductive vias extending through the core layer. The second redistribution structure electrically couples the drain pad of the second transistor to the switch node pad formed in the second redistribution layer on the second side of the core layer. The semiconductor module further comprises a third redistribution structure comprising a lateral redistribution structure formed in the first redistribution layer arranged on the first side of the core layer and one or more conductive vias extending through the core layer. The third redistribution structure electrically couples the source pad of the first transistor to the switch node pad formed in the second redistribution layer on the second side of the core layer.

In some embodiments, the first transistor device and the second transistor device each have a substantially cuboid shape and are positioned in a L-shape on the first redistribution layer.

In some embodiments, the control chip comprises gate driver circuitry for driving the first and second transistor devices.

In some embodiments, the control chip has a thickness that is greater than a thickness of the first and second transistor devices.

In some embodiments, the first and second transistor devices are a MOSFET (Metal Oxide Semiconductor Field Effect Transistor) device, an insulated gate bipolar transistor (IGBT) device or a Bipolar Junction Transistor (BJT).

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 2A and 2B illustrate a cross-sectional view along the line A-A and a cross-sectional view along the line B-B, respectively, of the layout of FIG. 1 of a semiconductor module according to an embodiment.

FIGS. 5A and 5B illustrate a cross-sectional view along the line A-A and a cross-sectional view along the line B-B, respectively, of the layout FIG. 1 of a semiconductor module according to an embodiment.

FIGS. 6A and 6B illustrate a cross-sectional view along the line A-A and a cross-sectional view along the line B-B, respectively, of the layout FIG. 1 of a semiconductor module according to an embodiment.

FIGS. 7A and 7B illustrate a cross-sectional view along the line A-A and a cross-sectional view along the line B-B, respectively, of the layout FIG. 1 of a semiconductor module according to an embodiment.

DETAILED DESCRIPTION

Figure 1:
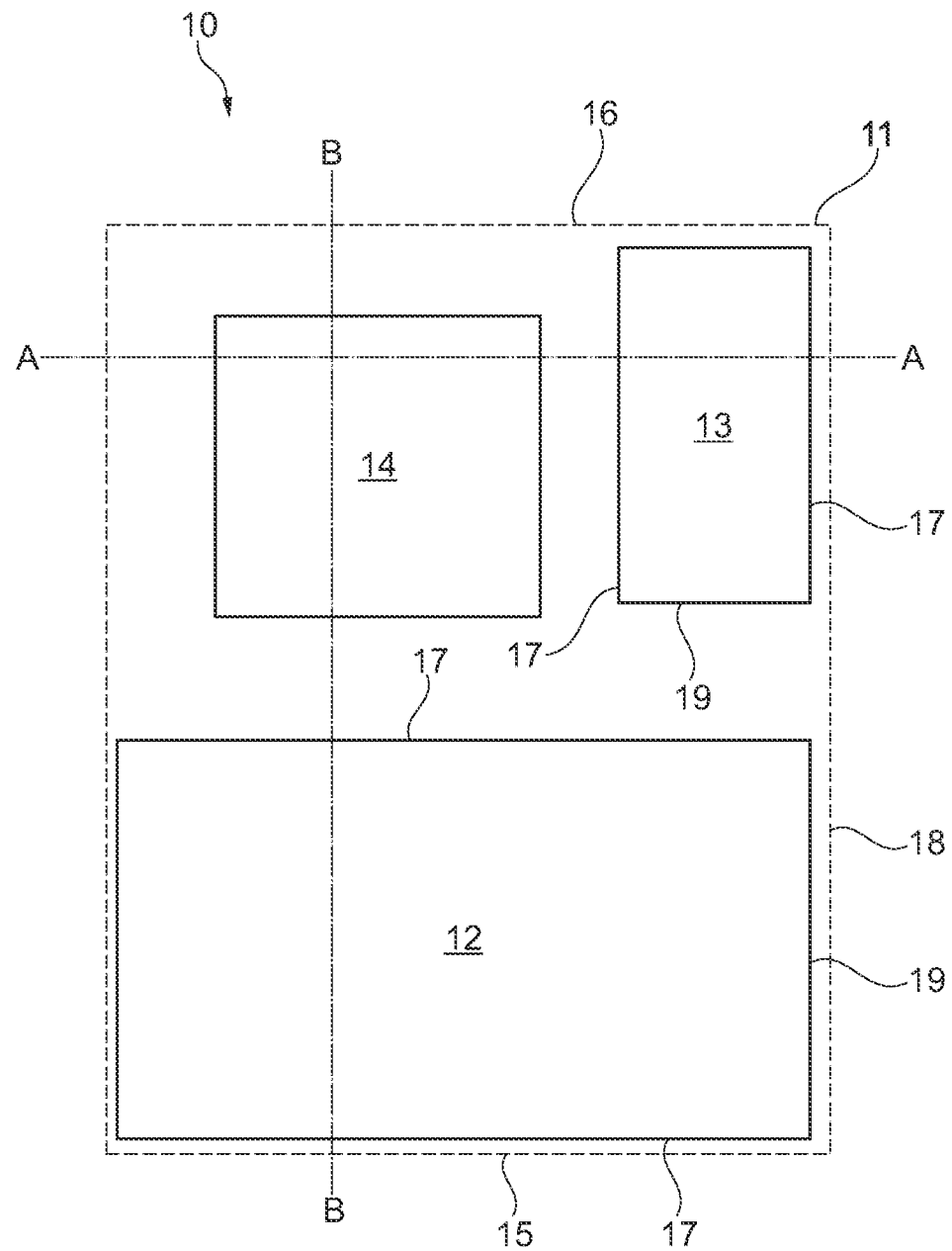
FIG. 1 illustrates a plan view of a layout for a semiconductor module.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure (s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It is desirable to provide a power stage which comprises a control chip and a power circuit, commonly one or more a half-bridge circuits or full bridge circuits, which has a peak high efficiency and a high load efficiency. According to the invention, the tradeoff between rerouting the signal part of the internal redistribution structure with the demand of a minimum line space and the power part of the internal redistribution structure with the ability of handling high currents is addressed. A construction is provided that combines low parasitics with via connections at the signal side and a large, thick Cu layer at the power side by the use of a package technology with chip embedding and a vertical power transistor device with a vertical drift path, e.g. a MOSFET, having Through Silicon Vias (TSV) in order to optimize the signal and power layout of the redistribution structure within the package or module providing the power stage.

The two power vertical transistor devices are packaged using Chip Embedding with a faceup/down construction and double-sided interconnects. Due to the use of the TSVs in at least one of the transistor devices, the signal part of the redistribution structure for all the devices of the package can be arranged on one side of the package and rerouted with enhanced design rules for fine lines. The power part of the redistribution structure is arranged on the opposite side and can be processed with thicker Cu layer and power design rules. This enables a signal side of the redistribution structure with a reduced via diameter and smaller pads on driver, a smaller line/space more flexibility for rerouting and a power side using a thicker Cu layer with increased electrical performance.

Furthermore, thin MOSFETs and a thicker control chip with gate driver circuitry can be combined in one package. For example, the two power transistor devices, e.g. MOSFETs may have a die thickness of around 20 µm, e.g. 10 µm to 40 µm with an overall thickness around 40 µm, e.g. 30 µm to 60 µm and the driver thickness can be greater, e.g. at least 60 µm.

A panel manufacturing process flow and larger panel size can be used which can reduce manufacturing costs. Additionally, plated interconnects have a higher reliability than wire bond connections and via and/or fully plated Cu connects to Cu front side metal chips have a very high robustness.

"Face up" denotes an orientation in which the source pad and cell field faces upwards and the drain pad faces downwards with respect co one side of the package and "face down" denotes an orientation in which the drain pad faces upwards and the source pad and cell field faces downwards with respect to that side of the package. For two vertical transistor devices, face up/face down means that Drain of a first transistor and Source of the second transistor face towards the same side of the package. In some embodiments, one of the vertical transistor devices has the gate connection moved from Source side to Drain side with Through Silicon Vias.

In some embodiments, all of the smaller Pads on the transistor devices, e.g. Gate, Sense, Kelvin, Auxiliary Gate, Sense, Kelvin, are facing to one side. If the vertical transistor device providing the low side switch of the half-bridge includes the TSVs, the low side switch can also have the capability of an internal auxiliary FET.

In some embodiments, the redistribution layer providing the power part of the internal redistribution structure may have a two-layer design to provide the connection between the high side switch and the low side switch, i.e. the switch node connector, and can include large areas thick Cu plating. The top or outermost layer can be covered and/or define pads for mounting passive devices on top such as a resistor, capacitor or an inductor. The redistribution layer providing the signal part of the internal redistribution structure is used to rerouting the signal I/O to the MOSFETs pads. Fine line technology can be used for this layer. Consequently, a thinner laminate and Cu RDL thickness can be used which enables smaller via diameter, smaller line/space, smaller pads on driver with lower pitch and more signal pads on driver The control chip and the transistor devices can have different chip thicknesses, because the signal pins are facing one side and can be rerouted with one laminate thickness. The different laminate thickness between driver and the transistor device, which is needed to encapsulate the thicker driver, lead to a larger via depth to the transistor devices. This layer can be processed more easily because this provides the power side, where larger via diameter or large opening on the die can be applied and signal pins no longer need to be connected.

This concept is not limited to a semiconductor module including a single half-bridge and can be extended to full bridges or combinations of half bridges. The expected higher efficiency combined with a small package outline will give a benefit to the customer system as the device with a better electrical performance can be placed nearer to the CPU.

FIG. 1 illustrates a schematic plan view of a layout of semiconductor module 10 which illustrates the arrangement of the devices within the outline 11 of the module 10. The semiconductor module 10 includes a first transistor device 12, a second transistor device 13 and a control chip 14. The first transistor device 12 is positioned towards a first side face of the semiconductor module 10. The second transistor device 13 and the control chip 14 are arranged in a row adjacent the opposing second side face 16 of the semiconductor module. The first transistor device 12 and the second transistor device 13 may be considered to be arranged to form a general L-shape. Each of the transistor devices 12, 13 has a substantially cuboid shape and is arranged such that its long side 17 extends substantially parallel to adjoining side faces 15, 18 of the semiconductor module 10. Consequently, the shorter side face 19 of the second transistor 13 faces towards and is substantially parallel to the long side face 17 of the first transistor device 12.

The first and second transistor 12, 13 are electrically coupled to form a half-bridge circuit in which the first transistor 12 provides the low side switch and the second transistor 13 provides the high side switch of the half bridge circuit. The control chip 14 includes gate driver circuitry for driving the gates of the first and second transistor 12, 13.

FIGS. 2A to 7B illustrate respective cross-sectional views of semiconductor modules which have the layout of the first transistor 12, second transistor 13 and control chip 14 illustrated in FIG. 1.

FIGS. 2A and 2B illustrate a semiconductor module 10 with the layout illustrated in FIG. 1. FIG. 2A illustrates a cross-sectional view of the semiconductor module 10 along the line A-A of FIG. 1 and depicts a cross-sectional view of the control chip 14 and the second transistor 13 that provides the high side switch of the half-bridge circuit. FIG. 2B illustrates a cross-sectional view along the line B-B shown in FIG. 1 and illustrates a cross-sectional view of the control chip 14 and the first transistor device 12 that provides the low side switch of the half-bridge circuit.

The semiconductor module 10 has a laminated structure comprising an electrically insulating core layer 20 having a first side 21 and the second side 22 that opposes the first side 21. A first redistribution layer 23 is arranged on the first side 21 and second redistribution layer 24 is arranged on the second side 22 of the core layer 20. The first transistor device 12 and the second transistor device 13 are coupled to form a half bridge circuit. The first transistor device 12 has a first side 25 at which a cell field 26 is arranged and a second side 27 opposing the first side 25. Similarly, the second transistor device 13 has a first side 28 at which a cell field 29 is arranged and a second side 30 that opposes the first side. The control chip 14 has a first side 31 with contact pads 32. The first transistor device 12, the second transistor device 13 and the control chip 14 are arranged laterally adjacent one another and are embedded in the core layer 20.

The first and second transistor devices 12, 13 are vertical transistor devices with a vertical drift path. The two opposing sides of a vertical transistor device are distinguishable by the location of the cell field of the vertical transistor device. A cell field includes a plurality of transistor cells each having providing a transistor device structure and a gate electrode. The second side of the transistor device fails to include any device structures and, therefore, has no cell field, but may include a high doped region acting as the drain of the transistor device. The side of the transistor device that includes the cell field may be denoted as the active surface.

The semiconductor modules illustrated in FIGS. 2A to 7B differ in the orientation of one or more of the first and second transistors 12, 13 with respect to the first redistribution layer 23 and consequently, also with respect to the second redistribution layer 21.

In the embodiment illustrated in FIGS. 2A and 2B, the first side 25 with the sell field 26 of the first transistor device 12 faces towards the first redistribution layer 23, the first side 31 of the control chip 14 faces towards the first redistribution layer 23 and the second side 30 of the second transistor device 13 faces towards the first redistribution layer 23. Consequently, the first side 28 with the cell field 29 of the second transistor device 13 faces towards the second redistribution layer 24 and the second side 27 of the first transistor device 12 faces towards the second redistribution layer 24. The two transistor devices 12, 13 can be considered to have opposite orientations since the cell fields 26, 29 face in opposite directions.

In this embodiment, the first transistor device 12 can be considered to have a face down arrangement and the second transistor device 13 can be considered to have a face up arrangement. The control chip 14 can be considered to have a facedown arrangement. The first side 31 of the control chip 14, the first side 25 of the first transistor device 12 and the second side 30 of the second transistor device 13 may be substantially coplanar.

The second transistor device 13 which provides the high side switch of the half bridge circuit further includes one or more conductive device vias 49 which extend between the first side 28 and the second side 30 and which are positioned within the semiconductor body of the device. The second transistor device 13 includes a source pad 33 and a gate pad 34 on its first surface 28 and a drain pad 35 on its second surface 30. The one or more conductive device vias 49 are used to electrically couple gate electrodes in the cell field 29 formed in the semiconductor body of the second transistor device 13 at the first side 28 to a further gate pad 36 arranged on the second side 30. The further gate pad 36 is spaced apart and electrically insulated from the drain pad 35. In some embodiments, the gate pad 34 on the first side 28 may be omitted.

The use of the one or more conductive device vias 49 and the repositioning of the gate pad. 36 on the second side 30 results in the connection for the gate electrodes facing towards the first redistribution layer 23. This arrangement enables the redistribution structure between the control chip 14 and the gate pad 36 of the second transistor device 13 to be formed solely within the first redistribution layer 23. Conductive vias within the core layer 20 for this connection are not needed. In some embodiments, the second transistor device 13 may include additional pads for providing additional functions, such as source sense pad and/or a kelvin pad. These additional pads are also arranged on the second side 30 and coupled to the cell field 29 by one or more conductive device vias. The redistribution structure between these additional pads and the control chip 14 is also provided solely by the first redistribution layer 23.

As can be seen in the cross-sectional view of FIG. 2B, the first transistor device 12 includes a source pad 37 and the gate pad 38 on its first surface 25 which faces towards the first redistribution layer 23. The first transistor device 12 includes a drain pad 50 arranged on its second surface side 27. Since the first transistor device 12 has a face down arrangement and the gate pad 38 on its first side 25 faces towards the first redistribution layer 23, the lateral redistribution structure between the control chip 14 and the gate 38 of the first transistor device 12 is provided solely by the first redistribution layer 23. Consequently, all of the lateral redistribution structures for the driver signals for the half-bridge circuit are arranged provided by the first redistribution layer 23 and, therefore, arranged on entirely on one side of the module 10 and one side of the core layer 20.

In some embodiments, the first transistor device 12 may include additional pads for providing additional functions, such as source sense pad and/or a kelvin pad. These additional pads are also arranged on the first side 25. The redistribution structure between these additional pads and the control chip 14 is also provided solely by the first redistribution layer 23.

The second redistribution layer 24 includes an electrically insulating layer 41 arranged on the side second 22 of the core layer 20 and an electrically conductive layer 40 arranged on the electrically insulating layer 41. The drain pad 50 of the first transistor device 12 is electrically coupled to the second redistribution structure 24 by one or more conductive vias 39 which extend through the electrically insulating layer 41 between the drain pad 50 and the conductive layer 40. Similarly, the source pad 35 of the second transistor device 13 is electrically connected to the conductive layer 40 of the second redistribution layer 24 by one or more conductive vias 42 which extend from the source pad 33 through the insulating layer 41 to the conductive layer 40. The conductive layer 40 of the second redistribution structure 24 provides the switch node connection and electrically couples the low side switch 12 and high side switch 13 of the half bridge circuit in series.

Since all of the signal redistribution structures are positioned on the first side 21 of the core layer 20, the second redistribution layer 24 provides the power redistribution layer and may be formed using a conductive layer 40 having a thickness which is greater than the thickness of the conductive layer providing the redistribution structures of the first redistribution layer 23.

The conductive layer 44 of the first redistribution layer 23 may have a thickness of around 10 µm to 50 µm whereas the conductive layer 40 of the second redistribution layer 24 may have a greater thickness, for example 5 µm to 200 µm.

In some embodiments, such as that illustrated in FIGS. 2A and 2B, the first redistribution layer 23 provides the outer contacts of the semiconductor module 10. In these embodiments, the semiconductor module 10 includes a further vertical conductive redistribution structure 43 which extends between the conductive layer 40 of the second redistribution layer 24 and the first redistribution layer 23. This vertical redistribution structure 43 may be provided by one or more conductive vias which extend through the insulating layer 41 of the second conductive layer 24 and through the core layer 20.

In some embodiments, the first redistribution layer 23 may include a single conductive layer 44 which is arranged on the first side 21 of the core layer 20. In other embodiments, the first redistribution layer 23 includes an electrically insulating layer which is arranged on the first side 21 of the core layer 20 and the conductive layer 44 which is arranged on the insulating layer. In these embodiments, conductive vias are arranged between the pads 32, 36, 35, 37, 38 which face towards the first redistribution layer 23 and the conductive layer 44.

The conductive layer 44 is then structured to provide a plurality of redistribution structures, for example and a lateral redistribution structure 51 between the gate pad 38 of the first transistor device 12 and the control chip 14, a lateral redistribution structure 52 between the gate pad 36 of the second transistor device 13 and the control chip 14. The conductive layer 44 is also structured to provide the $V_{low}$ pad 45 which is electrically coupled to the source pad 37 of the first transistor device 12, the switch node pad 46 which is electrically connected by means of the vertical redistribution structure 43 to the conductive layer 40, the $V_{high}$ pad 47 which is electrically coupled to the drain pad 35 of the second transistor device 13 and one or more signal pads 48. These pads may include further conductive layers arranged on the conductive layer 44. The first and second transistor devices 12, 13 are coupled in series between the $V_{low}$ pad 45 and the $V_{high}$ pad 47 by means of the switch node connection which is provided by the conductive vias 39, 42, 43 and the conductive layer 40 of the second redistribution structure 24.

The semiconductor module 10 has a layered laminated structure and may be fabricated using printed circuit board manufacturing processes. The core layer 20 may be formed of a thermosetting resin which is reinforced with a filler material. The core layer 20 may include a substantially planar prefabricated board including a material such as glass fibre reinforced matrix, or other material, which is typically used to fabricate a core layer for a printed circuit board. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example. The insulating layers 41 of the first and second redistribution layer 23, 24 may be formed of so called pre-preg, which comprise sheets of glass cloth impregnated with uncured epoxy resin. The pre-preg layers may also be used to fill any gaps or differences in height around and between the devices 12, 13, 14. The conductive layers 40, 44 of the redistribution layers 23, 24 may be formed of copper.

In some embodiments, the first and/or second redistribution layer 23, 24 may include a multilayer structure including two or more lateral conductive layers and, optionally, conductive vias which extend between these conductive layers. A multilayer structure may be useful for providing more complex redistribution structures, for example if one or both of the transistor devices 12, 13 includes additional sense functionality.

Figure 3:
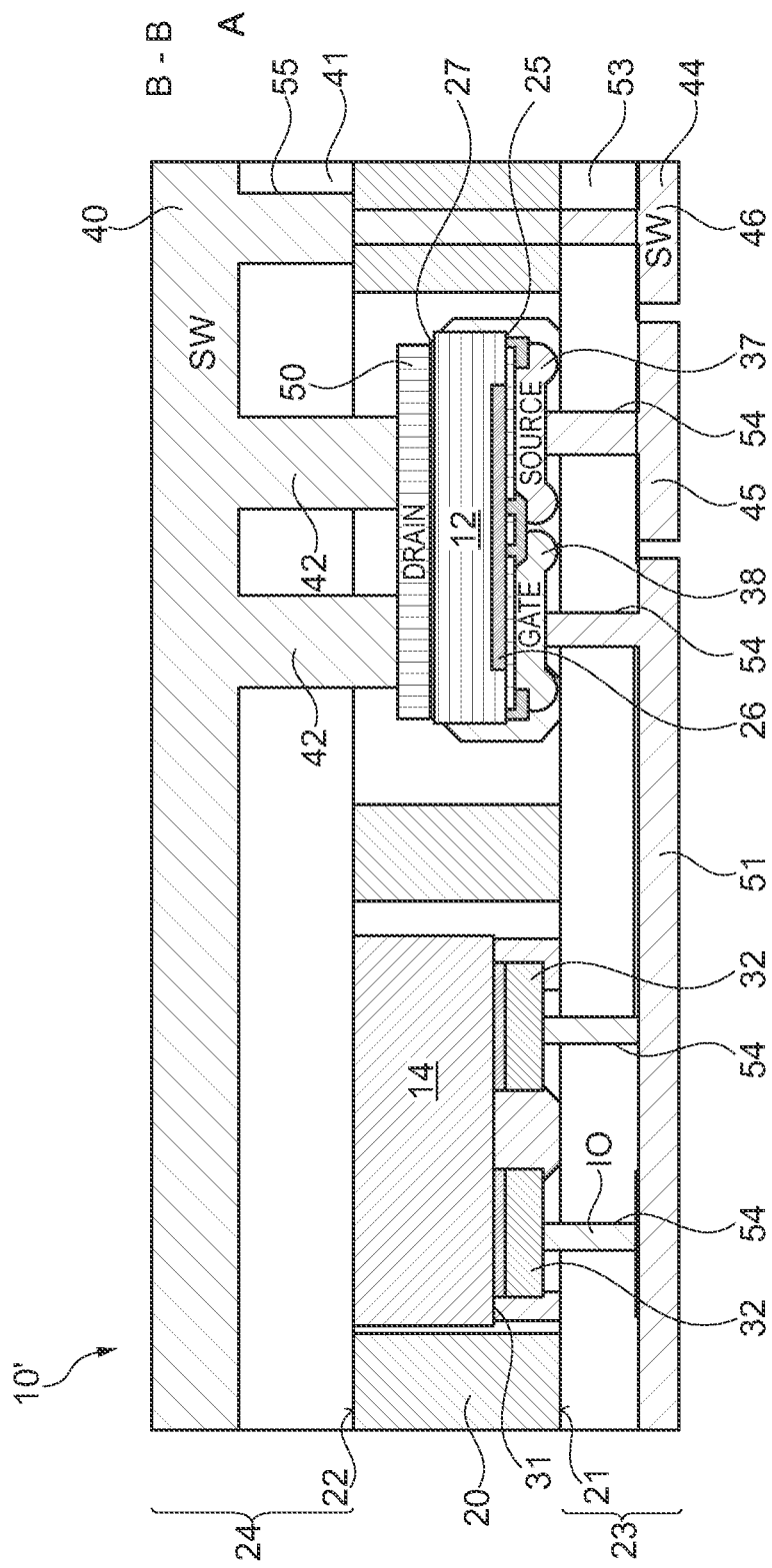
FIG. 3 illustrates a cross-sectional view along the line B-B of the layout of FIG. 1 of a semiconductor module according to an embodiment.

FIG. 3 illustrates a cross-sectional view of a semiconductor module 10' along the line B-B of FIG. 1 and illustrates the cross-sectional view of the first transistor device 12 which provides the low side switch of the half bridge circuit and the control chip 14. The semiconductor module 10' differs from the semiconductor module 10 illustrated in FIGS. 2A and 2B in that two conductive vias 42 are provided which extend between the drain pad 50 on the second side 27 of the first transistor device 12 and the conductive layer 40 of the second redistribution layer 24.

Also illustrated in FIG. 3, is a view of the first redistribution structure 23 which depicts the electrically insulating layer 53 positioned on the first side 21 of the core layer 20 and the conductive vias 54 extending between the contact pads 32 of the control chip 14 and the conductive layer 44 of the first redistribution layer 23 and the conductive via 54 extending between the gate pad 38 and the conductive layer 44 and the portion of the conductive layer 44 which provides the lateral signal redistribution structure 51 between the gate pad 38 and the control chip 14. FIG. 3 also illustrates a conductive via 54 between the source pad 37 and the $V_{low}$ pad 15 and the conductive via 55 which extends through the insulating layers 41, 49 and the core layer 20 between the conductive layer 40 of the second redistribution layer 24 and the switch node pad 46. The contact pads 45, 46 47, 48 and the lateral redistribution structures 51, 52 are spaced apart and electrically insulated from one another by intervening regions of the electrically insulating layer 53.

Figure 4:
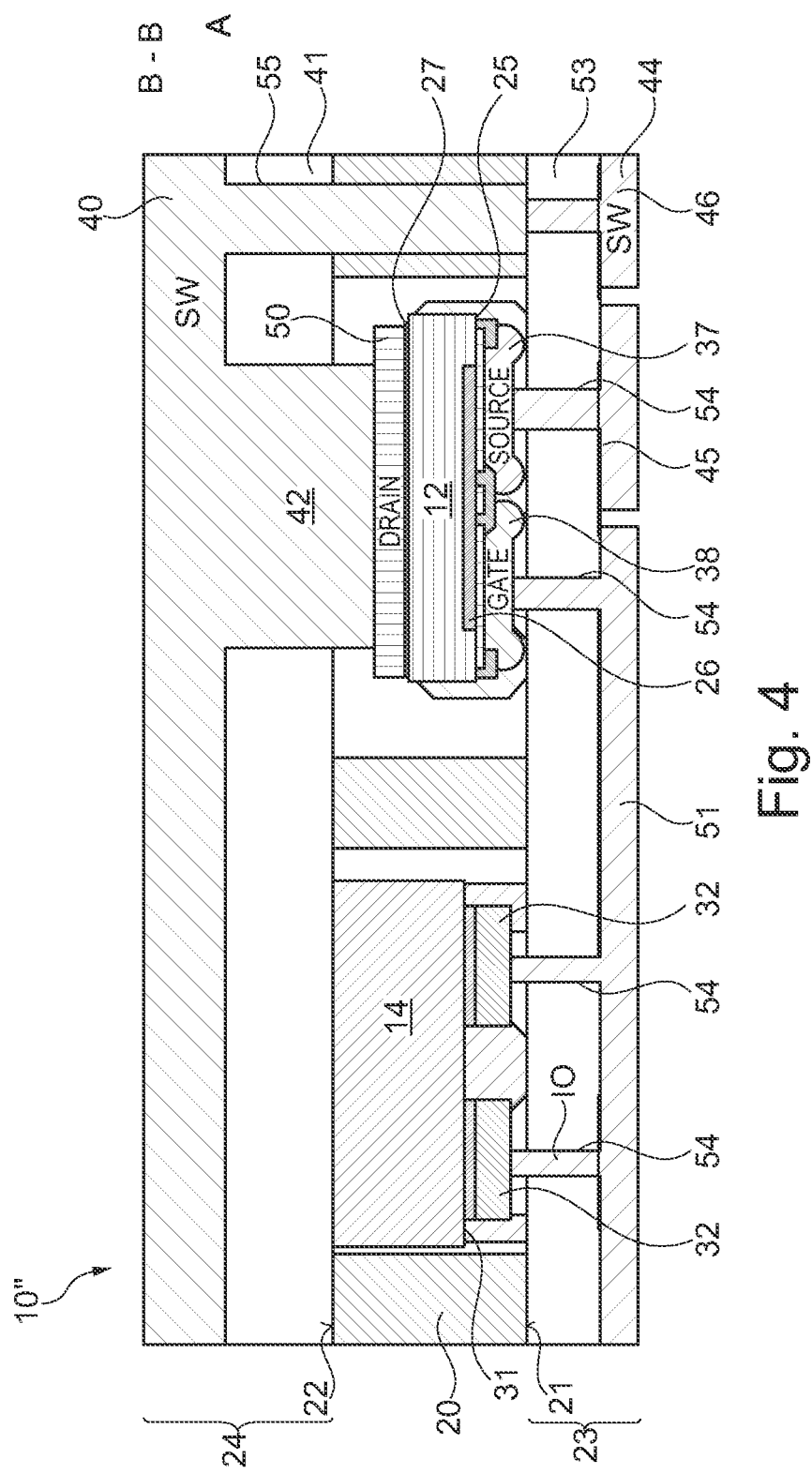
FIG. 4 illustrates a cross-sectional view along the line B-B of the layout of FIG. 1 of a semiconductor module according to an embodiment.

FIG. 4 illustrates a cross-sectional view of a semiconductor module 10" and illustrates a cross-sectional view along the line B-B of the control chip 14 and the first transistor device 12 providing the low side switch of the half bridge circuit. In this embodiment, a single large area conductive via 42 is provided between the drain pad 50 on the second side 27 of the first transistor device 12 and the conductive layer 40 of the second redistribution layer 24. The conductive via 42 may have a lateral area which is only slightly smaller than the lateral area of the drain pad 50 and may be used to provide a conductive via with a lower resistance and, therefore, to reduce the resistance of the switch node connection.

FIGS. 5A and 5B illustrate respective cross-sectional views of a semiconductor module 60, which includes a first transistor device 12, a second transistor device 13 and a control chip 14 having the lateral arrangement illustrated in FIG. 1. The first transistor device 12 and the second transistor device 13 are electrically coupled in series to provide a half-bridge circuit. FIG. 5A illustrates a cross-sectional view along the line A-A and illustrates a cross-sectional view of the control chip 14 and the second transistor device 13 and FIG. 5B illustrates a cross-sectional view along the line B-B and the control 14 and the first transistor device 12.

As in the embodiments illustrated in FIGS. 2A to 4, the semiconductor module 60 includes a core layer 20, in which the first transistor device 12, second transistor device 13 and control chip 14 are embedded, a first redistribution layer 23 arranged on the first side 21 of the core layer and a second redistribution layer 24 arranged on the second side 22 of the core layer 20.

The semiconductor module 60 differs from the semiconductor module 10, 10', 10" illustrated in FIGS. 2A to 4 in the orientation of the first transistor device 12 and second transistor device 13 with respect to the first redistribution layer 23. In the embodiment illustrated in FIGS. 5A and 5B, the first transistor device 12 has art orientation in which its first side 25 at which the cell field 26 is arranged faces upwardly towards the second redistribution layer 24 and its second side 27 faces towards the first redistribution layer 23. The first transistor device 12 can be considered to have the opposite orientation to that illustrated in FIGS. 2A to 4 and be can be considered to have a face up arrangement. The second transistor device 13 is orientated such that its first surface 28 at which the cell field 29 is arranged faces towards the first redistribution layer 23 and its second side 30 faces towards the second redistribution layer 24. Therefore, the second transistor device 13 can be considered have the opposite orientation to that of the embodiments illustrated in FIGS. 2A to 4 and can be considered to have a face down arrangement.

The second transistor device 13 does not include a conductive device via in this embodiment. The gate pad 34 on the first side 28 faces towards the first redistribution layer 23 and is electrically coupled to the control chip 14 by a redistribution layer structure 52 provided solely by the first redistribution layer 23. In contrast, the first transistor device 12 includes a conductive device via 61 which electrically couples the gate electrodes in the cell field 26 which faces upwardly towards the second redistribution layer 24 to a gate pad 62 which is positioned on the opposing second side 27 adjacent the drain pad 35. The gate pad 38 positioned on the first side 25 may be omitted. The conductive redistribution structures 51, 52 for the signals between the control chip 14 and the gate electrodes of the first and second transistor devices 12, 13 are provided by the first redistribution layer 23.

Due to the opposite orientation of the first transistor 12 and second transistor 13 with respect to the first redistribution layer 23, the drain pad. 35 of the second transistor device 13 is electrically connected to the conductive layer 40 of the second redistribution layer 24 by the conductive via 39 that extends through the insulating layer 41. The source pad 37 of the first transistor device 12 is electrically connected to the conductive layer 40 of the second redistribution layer 24 by the conductive via 42 that extends through the insulating layer 41.

In FIGS. 5A and 5B, the various redistribution structures provided by the first redistribution layer 23 are indicated schematically.

In the semiconductor module 60, the second redistribution layer 24 arranged on the second side 20 of the core layer 20 provides the footprint of the semiconductor module 60 and comprises the contact pads 45, 46, 47, 48.

The semiconductor module 60 therefore includes a first redistribution structure 63 which electrically couples one or more contact pads 32 of the control chip 14 to one or more of the logic pads 48 formed in the second redistribution layer 24. The first redistribution structure 63 is indicated schematically in FIGS. 5A and 5B and includes a lateral redistribution structure 64 formed in the first redistribution layer 23 on the first side 21 of the core layer 20 and one or more conductive vias 65 which extend through the core layer 20 as well as the further electrically insulating layers 41, 53 of the first and second redistribution layer 23, 24.

The semiconductor module 60 further includes a second redistribution structure 66 which electrically couples the drain pad 50 of the first transistor device 12 to the switch node pad 46 formed in the second redistribution layer 24 on the opposing side of the module 60. The second redistribution structure 66 includes a lateral redistribution structure 67 formed in the first redistribution layer 23 on the first side 21 of the core layer 20 and one or more conductive vias 68 which extend through the core layer 20 and any further electrical insulating layers 41, 53 of the first and second redistribution layers 23, 24.

The semiconductor module 60 further includes a third redistribution structure 69 which electrically couples the source pad 38 of the second transistor device 13 providing the high side switch and the switch node contact 46 formed in the second redistribution layer 24 arranged on the second side 22 of the core layer 20. The third redistribution layer 69 includes a lateral redistribution structure 70 in the first redistribution layer 23 arranged on the first side 21 of the core layer 20 and a conductive via 71 which extends through the core layer 20 and any additional electrical insulating layers 41, 53 of the first and second redistribution layer 23, 24. The $V_{high}$ pad 47 formed in the second redistribution layer 24 is electrically coupled by the one or more conductive vias 39 which extend between the drain pad 35 of the second transistor device 13 and the conductive layer 40 of the second redistribution structure 24. The source pad 37 of the first transistor device 12 providing the low side switch is electrically coupled to the $V_{low}$ pad 45 formed in the conductive layer 40 of the second redistribution layer 24 by the one or more conductive vias 42.

In the semiconductor module 60 illustrated in FIGS. 5A and 5B, the electrical redistribution structure 51, 52 between the gate pads 38, 36 of the first and second transistor devices 12, 13, respectively, and the control chip 14 is provided solely by the first redistribution layer 23.

FIGS. 6A and 6B illustrate a semiconductor module 80 which includes a first transistor device 12 providing the low side switch of half bridge circuit, a second transistor device 13 providing the high side switch of a high of the half bridge circuit and a control chip 14 which are embedded in a core layer 20. FIG. 6A illustrates a cross-sectional view along the line A-A and FIG. 6B a cross-sectional view along the line B-B of the layout FIG. 1.

The orientation of the first and second transistor devices 12, 13 with respect to the first redistribution layer 23 arranged on the first side 21 of the core layer 20 is the same as that illustrated in FIGS. 5A and 5B so that the first side 25 of the first transistor device 12 at which the cell field 26 is arranged faces towards the second redistribution layer 24 arranged on the opposing second side 22 of the core layer 20 and the second side 27 faces towards the first redistribution layer 23. The first side 28 of the second transistor device 13 at which the cell field 29 is arranged faces towards the first redistribution layer 23 and the second side 30 faces towards the second redistribution layer 24.

In the semiconductor module 80, neither of the transistor devices 12, 13 includes a conductive device via. Therefore, compared to the semiconductor module 60, the first transistor device 12 does not include a further second pad electrically coupled to the gate electrodes positioned on its second surface 12 and includes only a drain pad 50 on its second surface 27. The single gate pad 38 faces upwardly towards the second redistribution layer 24.

The semiconductor module 80 includes a redistribution structure 81 which electrically couples the gate pad 38 facing towards the second redistribution structure 24 to the contact pad 32 of the control chip 14 facing in the opposite direction towards the first redistribution 23. This redistribution structure 81 includes a conductive via 82 which extends from the gate pad 38 to the conductive layer 40 of the second redistribution layer 24, a lateral portion 83 of the conductive layer 40 which extends between the conductive via 82 and a further conductive via 84 which extends from the conductive layer 40 through the core layer 20 and any further electrical electrically insulating layers 41, 53 of the first and second redistribution layer 23, 24, a further lateral redistribution layer 85 formed in the first redistribution layer 23 and optionally further conductive via which extends from the lateral redistribution layer 85 to the contact pad 32.

The lateral redistribution structure 52 between the gate pad 34 of the second transistor device 13 and the control chip 30 is formed solely within the first redistribution layer 23.

In this embodiment, the second redistribution layer 21 provides the contact pads 45, 46, 47, 48 of the semiconductor module 80 such that the semiconductor module 80 includes a redistribution structure 63 from the control chip 14 to the logic pads 48 and one or more conductive vias 42 between the source pad 37 of the first transistor device 12 and the $V_{low}$ pad 45, a redistribution structure 66 which forms the switch node connection between the drain pad 50 of the first transistor device 12 and the source pad 33 of the second transistor device 13 and the switch node pad 46 and a conductive via 39 between the drain pad 35 of the second transistor device 30 and the $V_{high}$ pad 47.

The semiconductor module 80 can also be fabricated without need for one of the transistor devices to include a conductive device via which is positioned within the transistor device itself and may, for example, be useful for applications which have less demanding switching requirements.

As is illustrated in the cross-sectional views of the embodiments illustrated in FIGS. 2A to 6B, the use of chip embedding packaging techniques and the arrangement of the first transistor device 12, the second transistor device 13 and control chip 14 within the common core layer 20 enables the control chip 14 to have a different thickness from the thickness of the first and/or second transistor device 12, 13. This difference in thickness is easy to accommodate in embodiments in which the redistribution structure between the gate pads of the first and second transistor devices 12, 13 and the control contact pad 32 of the control chip 14 are formed within a single redistribution layer 23. The use of the laminated structure also enables differences in the height to be accommodated by the use of conductive vias between the pads and the conductive layers of the second redistribution layer 24, e.g. between the gate pad 38 and source pad 37 and the conductive layer 40 of the second redistribution structure 24 as in the embodiment illustrated in FIGS. 6A and 6B, since the opposing sides of the devices 12, 13, 14 are substantially coplanar.

In some embodiments, the thickness of the control chip 14 may be substantially the same as the thickness of the first and second transistor devices 12, 13. FIGS. 7A and 7B illustrate a semiconductor module 80', whereby FIG. 7A illustrates a cross-sectional view along the line A-A and FIG. 7B a cross-sectional view along the line B-B of the layout FIG. 1, in which the thickness of the control chip 14 is substantially the same as the thickness of the first and second transistor devices 12, 13. In this sense, the thickness refers to the total thickness of the device including the metallization layer(s) providing the pads on one side, in the case of the control chip 14, and on the two opposing sides in the case of the first and second transistor devices 12, 13. Other than the difference in the relative thickness of the control chip 14 compared to the thickness to the first and second transistor devices 12, 13, the semiconductor module 80' corresponds to the semiconductor module 80 with like parts being indicated with like reference signs.

In other non-illustrated embodiments, the thickness of the control chip 14 is substantially the same as the thickness of the first and second transistor devices 12, 13 in the semiconductor modules 10, 10', 10'', 60 described with reference to FIGS. 2A to 6B.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor module, the method comprising:
   forming a laminate structure comprising an electrically insulating core layer having a first side and a second side opposing the first side, a first redistribution layer arranged on the first side and a second redistribution layer arranged on the second side of the core layer;
   providing a first transistor device and a second transistor device, wherein the first transistor device has a first side at which a cell field is arranged and a second side opposing the first side, and the second transistor device has a first side at which a cell field is arranged and a second side opposing the first side; and
   providing a control chip having a first side with contact pads;
   embedding the first transistor device, the second transistor device and the control chip in the core layer such that the first transistor device, the second transistor device and the control chip are arranged laterally adjacent one another
   forming a half-bridge circuit that comprises the first transistor device connects to the second transistor device,
   wherein the first side of the control chip, the first side of one of the first and second transistor devices and the second side of the other one of the first and second transistor devices face towards the first redistribution layer on the first side of the core layer.

2. The method of claim 1, wherein embedding the first transistor device, the second transistor device and the control chip comprises providing the second transistor device and the control chip comprises within openings in the core layer and filling gaps in the openings with insulating material.

3. The method of claim 1, wherein the semiconductor module is formed by a paned manufacturing process.

4. The method of claim 1, wherein the first side of one of the first and second transistor devices, and the second side of the other one of the first and second transistor devices and the first side of the control chip are substantially coplanar.

5. The method of claim 1, wherein
the first transistor device provides a low side switch of the half-bridge circuit;
the second transistor device provides a high side switch of the half-ridge circuit;
the first side of the first transistor device faces towards the first redistribution layer;
the second side of the second transistor device faces towards the first redistribution layer; and
the second transistor device comprises one or more conductive device vias such that gate electrodes in the cell field at the first side of the second transistor device are electrically coupled by the one or more conductive device vias to a pad arranged on the second side of the second transistor device.

6. The method of claim 5, wherein the semiconductor module comprises a footprint comprising a $V_{high}$ pad, a $V_{low}$ pad, a switch node pad and one or more logic pads formed in the first redistribution layer on the first side of the core layer.

7. The method of claim 6, wherein the first and second transistor devices are coupled in series between the $V_{low}$ pad and the $V_{high}$ pad of the semiconductor module by a switch node connection.

8. The method of claim 7, wherein the switch node connection is provided by the second redistribution layer arranged on she second side of the core layer and is coupled to the switch node pad that is arranged on the first side of the core layer by one or more conductive vias that extend through the core layer.

9. The method of claim 7, wherein the first redistribution layer is structured and provides a signal redistribution structure coupling the control chip to a gate pad on the first side of the first transistor device and to a gate pad on the second side of the second transistor device, and wherein the signal redistribution structure is arranged entirely on the first side of the core layer.

10. The method of claim 7, further comprising:
one or more conductive vias extending between a source pad arranged on a first side of the second transistor device and the switch node connection; and
one or more conductive vias extending between a drain pad on the second side of the first transistor device and the switch node connection.

11. The method of claim 1, wherein:
the first transistor device provides a high side switch of the half-bridge circuit;
the second transistor device provides a low side switch of the half-bridge circuit;
the first side of the first transistor device faces towards the first redistribution layer;
the second side of the second transistor device faces towards the first redistribution layer; and
the second transistor device comprises one or more conductive device vias such that gate electrodes in the cell fief d at the first side of the second transistor device are electrically coupled by the one or more conductive device vias to a pad arranged on the second side of the second transistor device.

12. The method of claim 11, wherein the semiconductor module comprises a footprint comprising a $V_{high}$ pad, a $V_{low}$ pad, a switch node pad and one or more logic pads formed in the second redistribution layer on the second side of the core layer.

13. The method of claim 12, further comprising:
a first redistribution structure comprising a lateral redistribution structure formed in the first redistribution layer on the first side of the core layer; and
one or more conductive vias extending through the core layer, wherein the first redistribution structure electrically couples one or more contact pads of the control chip to one of the logic pads formed in the second redistribution layer on the second side of the core layer;
a second redistribution structure comprising a lateral redistribution structure formed in the first redistribution layer on the first side of the core layer and one or more conductive vias extending through the core layer, wherein the second redistribution structure electrically couples the drain pad of the second transistor device to the switch node pad formed in the second redistribution layer on the second side of the core layer;
a third redistribution structure comprising a lateral redistribution structure formed in the first redistribution layer on the first side of the core layer and one or more conductive vias extending through the core layer, wherein the third redistribution structure electrically couples the source pad of the first transistor device to the switch node pad formed in the second redistribution layer on the second side of the core layer.

14. The method of claim 1, wherein:
the first transistor device provides a high side switch of the half-bridge circuit;
the second transistor device provides a low side switch of the half-bridge circuit;
the first side of the first transistor device faces towards the first redistribution layer; and
the second side of the second transistor device faces towards the first redistribution layer,
the semiconductor module further comprising:
one or more conductive vias extending through the core layer to couple one or more contact pads on the first side of the control chip that face towards the first redistribution layer to a gate pad of the second transistor device that faces towards the second redistribution layer.

15. The method of claim 14, wherein the semiconductor module comprises a footprint comprising a $V_{high}$ pad, a $V_{low}$ pad, a switch node pad and one or more logic pads formed in the second redistribution layer on the second side of the core layer.

16. The method of claim 15, further comprising:
a first redistribution structure comprising a lateral redistribution structure formed in the first redistribution layer on the first side of the core layer; and
one or more conductive vias extending through the core layer, wherein the first redistribution structure electrically couples one or more contact pads of the control chip to one of the logic pads formed in the second redistribution layer on the second side of the core layer;
a second redistribution structure comprising a lateral redistribution structure formed in the first redistribution layer on the first side of the core layer and one or more conductive vias extending through the core layer, wherein the second redistribution structure electrically couples the drain pad of the second transistor device to the switch node pad formed in the second redistribution layer on the second side of the core layer;

a third redistribution structure comprising a lateral redistribution structure formed in the first redistribution layer on the first side of the core layer and one or more conductive vias extending through the core layer, wherein the third redistribution structure electrically couples the source pad of the first transistor device to the switch node pad formed in the second redistribution layer on the second side of the core layer.

17. The method of claim 1, wherein the first transistor device and the second transistor device each have a substantially cuboid shape and are positioned in a L-shape on the first redistribution layer.

18. The method of claim 1, wherein the control chip comprises gate driver circuitry for driving the first and second transistor devices.

19. The method of claim 1, wherein the control chip has a thickness that is greater than a thickness of the first and second transistor devices.

20. The method of claim 1, wherein the first transistor device is a vertical transistor device with a vertical drift path, and wherein the second transistor device is a vertical transistor device with a vertical drift path.

* * * * *

UNITED STATES PATENT AND TRADEMARK OFFICE
CERTIFICATE OF CORRECTION

PATENT NO. : 12,087,740 B2
APPLICATION NO. : 18/381929
DATED : September 10, 2024
INVENTOR(S) : A. Kessler et al.

It is certified that error appears in the above-identified patent and that said Letters Patent is hereby corrected as shown below:

On the Title Page

Item (57)/Abstract, Line 7, please change "Bots" to -- Both --

In the Claims

Column 15, Line 62 (Claim 11), please change "fief d" to -- field --

Signed and Sealed this
Twelfth Day of November, 2024

Katherine Kelly Vidal
*Director of the United States Patent and Trademark Office*